US008019091B2

(12) United States Patent
Burnett et al.

(10) Patent No.: US 8,019,091 B2
(45) **Date of Patent: *Sep. 13, 2011**

(54) VOICE ACTIVITY DETECTOR (VAD) -BASED MULTIPLE-MICROPHONE ACOUSTIC NOISE SUPPRESSION

(75) Inventors: Gregory C. Burnett, Dodge Center, MN (US); Eric F. Breitfeller, Dublin, CA (US)

(73) Assignee: Aliphcom, Inc., San Francisco, CA (US)

( * ) Notice: Subject to any disclaimer, the term of this patent is extended or adjusted under 35 U.S.C. 154(b) by 713 days.

This patent is subject to a terminal disclaimer.

(21) Appl. No.: 10/667,207

(22) Filed: Sep. 18, 2003

(65) Prior Publication Data

US 2004/0133421 A1 Jul. 8, 2004

Related U.S. Application Data

(63) Continuation-in-part of application No. 09/905,361, filed on Jul. 12, 2001, now abandoned.

(60) Provisional application No. 60/219,297, filed on Jul. 19, 2000.

(51) Int. Cl.
*H03B 29/00* (2006.01)

(52) U.S. Cl. ...................................... 381/71.8; 704/215

(58) Field of Classification Search .................... 381/70, 381/94.1–94.7, 71.8, 91–92, 122, 71.1; 704/200, 704/231, 233, 246, 214–215
See application file for complete search history.

(56) References Cited

U.S. PATENT DOCUMENTS 3,789,166 A * 1/1974 Sebesta
4,006,318 A * 2/1977 Sebesta et al.
4,591,668 A * 5/1986 Iwata
4,901,354 A * 2/1990 Gollmar et al.
5,097,515 A * 3/1992 Baba
5,212,764 A 5/1993 Ariyoshi
5,400,409 A 3/1995 Linhard
5,406,622 A * 4/1995 Silverberg et al. ........... 381/94.7
5,414,776 A 5/1995 Sims, Jr.
5,463,694 A * 10/1995 Bradley et al. .................. 381/92
(Continued)

FOREIGN PATENT DOCUMENTS

EP 0 637 187 A * 2/1995
(Continued)

OTHER PUBLICATIONS

Zhao Li et al: "Robust Speech Coding Using Microphone Arrays", Signals Systems and Computers, 1997. Conf. record of 31st Asilomar Conf., Nov. 2-5, 1997, IEEE Comput. Soc. Nov. 2, 1997. USA.

(Continued)

*Primary Examiner* — Davetta Goins
*Assistant Examiner* — Lun-See Lao
(74) *Attorney, Agent, or Firm* — Gregory & Sawrie LLP

(57) ABSTRACT

Acoustic noise suppression is provided in multiple-microphone systems using Voice Activity Detectors (VAD). A host system receives acoustic signals via multiple microphones. The system also receives information on the vibration of human tissue associated with human voicing activity via the VAD. In response, the system generates a transfer function representative of the received acoustic signals upon determining that voicing information is absent from the received acoustic signals during at least one specified period of time. The system removes noise from the received acoustic signals using the transfer function, thereby producing a denoised acoustic data stream.

20 Claims, 10 Drawing Sheets

U.S. PATENT DOCUMENTS

| | | | | | |
|---|---|---|---|---|---|
| 5,473,701 | A | * | 12/1995 | Cezanne et al. | 381/92 |
| 5,473,702 | A | * | 12/1995 | Yoshida et al. | 381/94.7 |
| 5,515,865 | A | * | 5/1996 | Scanlon et al. | |
| 5,517,435 | A | * | 5/1996 | Sugiyama | 708/322 |
| 5,539,859 | A | | 7/1996 | Robbe et al. | |
| 5,590,241 | A | * | 12/1996 | Park et al. | 704/227 |
| 5,633,935 | A | * | 5/1997 | Kanamori et al. | 381/26 |
| 5,649,055 | A | | 7/1997 | Gupta et al. | |
| 5,684,460 | A | * | 11/1997 | Scanlon et al. | |
| 5,729,694 | A | * | 3/1998 | Holzrichter et al. | 705/17 |
| 5,754,665 | A | * | 5/1998 | Hosoi | 381/94.1 |
| 5,835,608 | A | | 11/1998 | Warnaka et al. | |
| 5,853,005 | A | * | 12/1998 | Scanlon | |
| 5,917,921 | A | | 6/1999 | Sasaki et al. | |
| 5,966,090 | A | | 10/1999 | McEwan | |
| 5,986,600 | A | | 11/1999 | McEwan | |
| 6,006,175 | A | * | 12/1999 | Holzrichter | 704/208 |
| 6,009,396 | A | | 12/1999 | Nagata | |
| 6,069,963 | A | * | 5/2000 | Martin et al. | |
| 6,191,724 | B1 | | 2/2001 | McEwan | |
| 6,266,422 | B1 | | 7/2001 | Ikeda | |
| 6,430,295 | B1 | | 8/2002 | Handel et al. | |
| 6,707,910 | B1 | * | 3/2004 | Valve et al. | 379/388.06 |
| 2002/0039425 | A1 | * | 4/2002 | Burnett et al. | |
| 2003/0228023 | A1 | * | 12/2003 | Burnett et al. | 381/92 |

FOREIGN PATENT DOCUMENTS

| | | | |
|---|---|---|---|
| EP | 0 795 851 A2 | * | 9/1997 |
| EP | 0 984 660 A2 | * | 3/2000 |
| JP | 2000 312 395 | * | 11/2000 |
| JP | 2001 189 987 | * | 7/2001 |
| WO | WO 02 07151 | * | 1/2002 |

OTHER PUBLICATIONS

L.C. Ng et al.: "Denoising of Human Speech Using Combined Acoustic and EM Sensor Signal Processing", 2000 IEEE Intl Conf on Acoustics Speech and Signal Processing. Proceedings (Cat. No. 00CH37100), Istanbul, Turkey, Jun. 5-9, 2000 XP002186255, ISBN 0-7803-6293-4.

S. Affes et al.: "A Signal Subspace Tracking Algorithm for Microphone Array Processing of Speech". IEEE Transactions on Speech and Audio Processing, N.Y, USA vol. 5, No. 5, Sep. 1, 1997. XP000774303, ISBN 1063-6676.

Gregory C. Burnett: "The Physiological Basis of Glottal Electromagnetic Micropower Sensors (GEMS) and Their Use in Defining an Excitation Function for the Human Vocal Tract", Dissertation. University of California at Davis, Jan. 1999, USA.

L.C. Ng et al.: "Speaker Verification Using Combined Acoustic and EM Sensor Signal Processing", ICASSP-2001, Salt Lake City, USA.

A. Hussain: "Intelligibility Assessment of a Multi-Band Speech Enhancement Scheme", Proceedings IEEE Intl. Conf. on Acoustics, Speech & Signal Processing (ICASSP-2000). Istanbul, Turkey, Jun. 2000.

* cited by examiner

VOICE ACTIVITY DETECTOR (VAD) -BASED MULTIPLE-MICROPHONE ACOUSTIC NOISE SUPPRESSION

RELATED APPLICATIONS

This patent application is a continuation-in-part of U.S. patent application Ser. No. 09/905,361, filed Jul. 12, 2001, now abandoned which claims priority from U.S. patent application Ser. No. 60/219,297, filed Jul. 19, 2000. This patent application also claims priority from U.S. patent application Ser. No. 10/383,162, filed Mar. 5, 2003.

FIELD OF THE INVENTION

The disclosed embodiments relate to systems and methods for detecting and processing a desired signal in the presence of acoustic noise.

BACKGROUND

Many noise suppression algorithms and techniques have been developed over the years. Most of the noise suppression systems in use today for speech communication systems are based on a single-microphone spectral subtraction technique first develop in the 1970's and described, for example, by S. F. Boll in "Suppression of Acoustic Noise in Speech using Spectral Subtraction," IEEE Trans. on ASSP, pp. 113-120, 1979. These techniques have been refined over the years, but the basic principles of operation have remained the same. See, for example, U.S. Pat. No. 5,687,243 of McLaughlin, et al., and U.S. Pat. No. 4,811,404 of Vilmur, et al. Generally, these techniques make use of a microphone-based Voice Activity Detector (VAD) to determine the background noise characteristics, where "voice" is generally understood to include human voiced speech, unvoiced speech, or a combination of voiced and unvoiced speech.

The VAD has also been used in digital cellular systems. As an example of such a use, see U.S. Pat. No. 6,453,291 of Ashley, where a VAD configuration appropriate to the front-end of a digital cellular system is described. Further, some Code Division Multiple Access (CDMA) systems utilize a VAD to minimize the effective radio spectrum used, thereby allowing for more system capacity. Also, Global System for Mobile Communication (GSM) systems can include a VAD to reduce co-channel interference and to reduce battery consumption on the client or subscriber device.

These typical microphone-based VAD systems are significantly limited in capability as a result of the addition of environmental acoustic noise to the desired speech signal received by the single microphone, wherein the analysis is performed using typical signal processing techniques. In particular, limitations in performance of these microphone-based VAD systems are noted when processing signals having a low signal-to-noise ratio (SNR), and in settings where the background noise varies quickly. Thus, similar limitations are found in noise suppression systems using these microphone-based VADs.

DETAILED DESCRIPTION

The following description provides specific details for a thorough understanding of, and enabling description for, embodiments of the noise suppression system. However, one skilled in the art will understand that the invention may be practiced without these details. In other instances, well-known structures and functions have not been shown or described in detail to avoid unnecessarily obscuring the description of the embodiments of the noise suppression system. In the following description, "signal" represents any acoustic signal (such as human speech) that is desired, and "noise" is any acoustic signal (which may include human speech) that is not desired. An example would be a person talking on a cellular telephone with a radio in the background. The person's speech is desired and the acoustic energy from the radio is not desired. In addition, "user" describes a person who is using the device and whose speech is desired to be captured by the system.

Also, "acoustic" is generally defined as acoustic waves propagating in air. Propagation of acoustic waves in media other than air will be noted as such. References to "speech" or "voice" generally refer to human speech including voiced speech, unvoiced speech, and/or a combination of voiced and unvoiced speech. Unvoiced speech or voiced speech is distinguished where necessary. The term "noise suppression"

generally describes any method by which noise is reduced or eliminated in an electronic signal.

Moreover, the term "VAD" is generally defined as a vector or array signal, data, or information that in some manner represents the occurrence of speech in the digital or analog domain. A common representation of VAD information is a one-bit digital signal sampled at the same rate as the corresponding acoustic signals, with a zero value representing that no speech has occurred during the corresponding time sample, and a unity value indicating that speech has occurred during the corresponding time sample. While the embodiments described herein are generally described in the digital domain, the descriptions are also valid for the analog domain.

Figure 1:
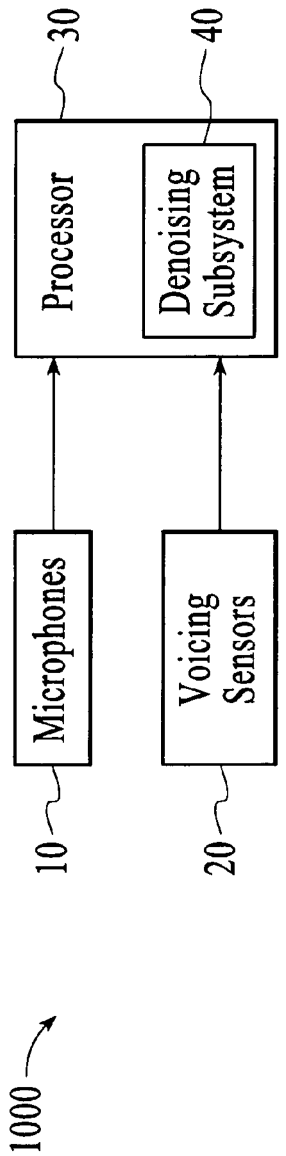
FIG. 1 is a block diagram of a denoising system, under an embodiment.

FIG. 1 is a block diagram of a denoising system 1000 of an embodiment that uses knowledge of when speech is occurring derived from physiological information on voicing activity. The system 1000 includes microphones 10 and sensors 20 that provide signals to at least one processor 30. The processor includes a denoising subsystem or algorithm 40.

Figure 2:
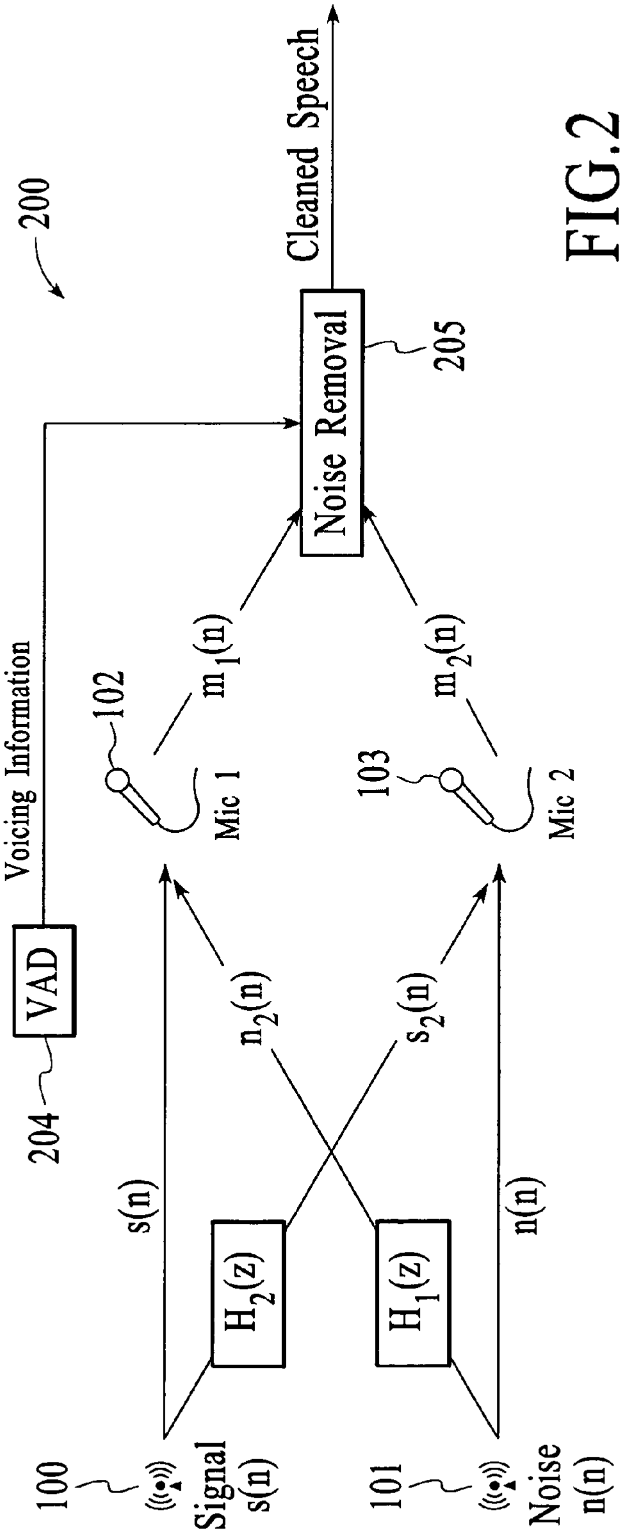
FIG. 2 is a block diagram including components of a noise removal algorithm, under the denoising system of an embodiment assuming a single noise source and direct paths to the microphones.

FIG. 2 is a block diagram including components of a noise removal algorithm 200 of an embodiment. A single noise source and a direct path to the microphones are assumed. An operational description of the noise removal algorithm 200 of an embodiment is provided using a single signal source 100 and a single noise source 101, but is not so limited. This algorithm 200 uses two microphones: a "signal" microphone 1 ("MIC1") and a "noise" microphone 2 ("MIC 2"), but is not so limited. The signal microphone MIC 1 is assumed to capture mostly signal with some noise, while MIC 2 captures mostly noise with some signal. The data from the signal source 100 to MIC 1 is denoted by s(n), where s(n) is a discrete sample of the analog signal from the source 100. The data from the signal source 100 to MIC 2 is denoted by $s_2(n)$. The data from the noise source 101 to MIC 2 is denoted by n(n). The data from the noise source 101 to MIC 1 is denoted by $n_2(n)$. Similarly, the data from MIC 1 to noise removal element 205 is denoted by $m_1(n)$, and the data from MIC 2 to noise removal element 205 is denoted by $m_2(n)$.

The noise removal element 205 also receives a signal from a voice activity detection (VAD) element 204. The VAD 204 uses physiological information to determine when a speaker is speaking. In various embodiments, the VAD can include at least one of an accelerometer, a skin surface microphone in physical contact with skin of a user, a human tissue vibration detector, a radio frequency (RF) vibration and/or motion detector/device, an electroglottograph, an ultrasound device, an acoustic microphone that is being used to detect acoustic frequency signals that correspond to the user's speech directly from the skin of the user (anywhere on the body), an airflow detector, and a laser vibration detector.

The transfer functions from the signal source 100 to MIC 1 and from the noise source 101 to MIC 2 are assumed to be unity. The transfer function from the signal source 100 to MIC 2 is denoted by $H_2(z)$, and the transfer function from the noise source 101 to MIC 1 is denoted by $H_1(z)$. The assumption of unity transfer functions does not inhibit the generality of this algorithm, as the actual relations between the signal, noise, and microphones are simply ratios and the ratios are redefined in this manner for simplicity.

In conventional two-microphone noise removal systems, the information from MIC 2 is used to attempt to remove noise from MIC 1. However, an (generally unspoken) assumption is that the VAD element 204 is never perfect, and thus the denoising must be performed cautiously, so as not to remove too much of the signal along with the noise. However, if the VAD 204 is assumed to be perfect such that it is equal to zero when there is no speech being produced by the user, and equal to one when speech is produced, a substantial improvement in the noise removal can be made.

In analyzing the single noise source 101 and the direct path to the microphones, with reference to FIG. 2, the total acoustic information coming into MIC 1 is denoted by $m_1(n)$. The total acoustic information coming into MIC 2 is similarly labeled $m_2(n)$. In the z (digital frequency) domain, these are represented as $M_1(z)$ and $M_2(z)$. Then, $$M_1(z)=S(z)+N_2(z)$$

$$M_2(z)=N(z)+S_2(z)$$

with $$N_2(z)=N(z)H_1(z)$$

$$S_2(z)=S(z)H_2(z),$$

so that $$M_1(z)=S(z)+N(z)H_1(z)$$

$$M_2(z)=N(z)+S(z)H_2(z) \qquad \text{Eq. 1}$$

This is the general case for all two microphone systems. In a practical system there is always going to be some leakage of noise into MIC 1, and some leakage of signal into MIC 2. Equation 1 has four unknowns and only two known relationships and therefore cannot be solved explicitly.

However, there is another way to solve for some of the unknowns in Equation 1. The analysis starts with an examination of the case where the signal is not being generated, that is, where a signal from the VAD element 204 equals zero and speech is not being produced. In this case, s(n) S(z)=0, and Equation 1 reduces to $$M_{1n}(z)=N(z)H_1(z)$$

$$M_{2n}(z)=N(z),$$

where the n subscript on the M variables indicate that only noise is being received. This leads to $$M_{1n}(z) = M_{2n}(z)H_1(z) \qquad \text{Eq. 2}$$

$$H_1(z) = \frac{M_{1n}(z)}{M_{2n}(z)}.$$

The function $H_1(z)$ can be calculated using any of the available system identification algorithms and the microphone outputs when the system is certain that only noise is being received. The calculation can be done adaptively, so that the system can react to changes in the noise.

A solution is now available for one of the unknowns in Equation 1. Another unknown, $H_2(z)$, can be determined by using the instances where the VAD equals one and speech is being produced. When this is occurring, but the recent (perhaps less than 1 second) history of the microphones indicate low levels of noise, it can be assumed that n(s)=N(z)~0. Then Equation 1 reduces to $$M_{1s}(z)=S(z)$$

$$M_{2s}(z)=S(z)H_2(z),$$

which in turn leads to $$M_{2s}(z) = M_{1s}(z)H_2(z)$$

-continued $$H_2(z) = \frac{M_{2s}(z)}{M_{1s}(z)},$$

which is the inverse of the $H_1(z)$ calculation. However, it is noted that different inputs are being used (now only the signal is occurring whereas before only the noise was occurring). While calculating $H_2(z)$, the values calculated for $H_1(z)$ are held constant and vice versa. Thus, it is assumed that while one of $H_1(z)$ and $H_2(z)$ are being calculated, the one not being calculated does not change substantially.

After calculating $H_1(z)$ and $H_2(z)$, they are used to remove the noise from the signal. If Equation 1 is rewritten as $$S(z)=M_1(z)-N(z)H_1(z)$$

$$N(z)=M_2(z)-S(z)H_2(z)$$

$$S(z)=M_1(z)-[M_2(z)-S(z)H_2(z)]H_1(z)'$$

$$S(z)[1-H_2(z)H_1(z)]=M_1(z)-M_2(z)H_1(z),$$

then N(z) may be substituted as shown to solve for S(z) as $$S(z) = \frac{M_1(z) - M_2(z)H_1(z)}{1 - H_2(z)H_1(z)}. \qquad \text{Eq. 3}$$

If the transfer functions $H_1(z)$ and $H_2(z)$ can be described with sufficient accuracy, then the noise can be completely removed and the original signal recovered. This remains true without respect to the amplitude or spectral characteristics of the noise. The only assumptions made include use of a perfect VAD, sufficiently accurate $H_1(z)$ and $H_2(z)$, and that when one of $H_1(z)$ and $H_2(z)$ are being calculated the other does not change substantially. In practice these assumptions have proven reasonable.

Figure 3:
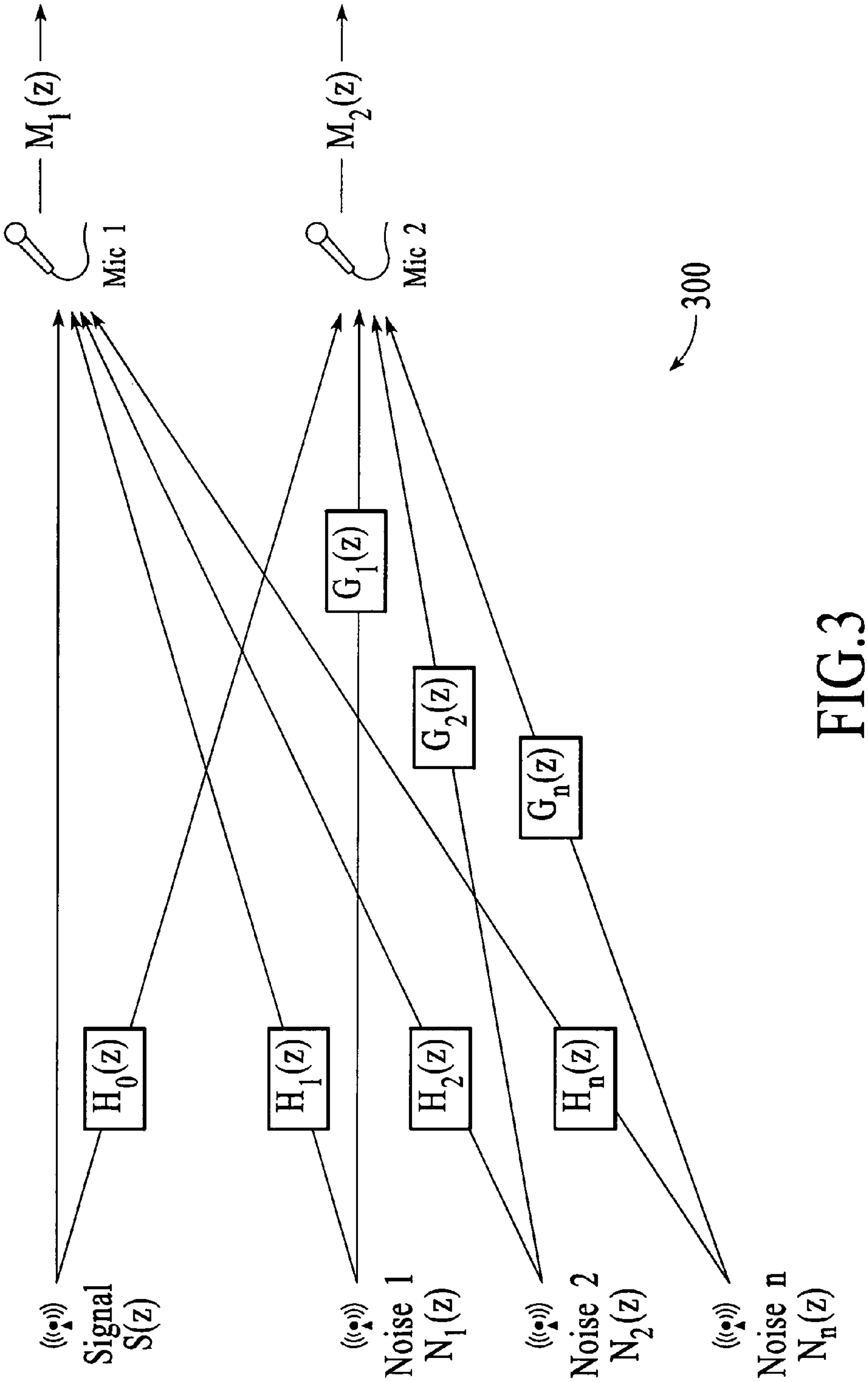
FIG. 3 is a block diagram including front-end components of a noise removal algorithm of an embodiment generalized to n distinct noise sources (these noise sources may be reflections or echoes of one another).

The noise removal algorithm described herein is easily generalized to include any number of noise sources. FIG. 3 is a block diagram including front-end components 300 of a noise removal algorithm of an embodiment, generalized to n distinct noise sources. These distinct noise sources may be reflections or echoes of one another, but are not so limited. There are several noise sources shown, each with a transfer function, or path, to each microphone. The previously named path $H_2$ has been relabeled as $H_0$, so that labeling noise source 2's path to MIC 1 is more convenient. The outputs of each microphone, when transformed to the z domain, are:

$$M_1(z)=S(z)+N_1(z)H_1(z)+N_2(z)H_2(z)+\ldots N_n(z)H_n(z)$$

$$M_2(z)=S(z)H_0(z)+N_1(z)G_1(z)+N_2(z)G_2(z)+\ldots N_n(z)G_n(z) \qquad \text{Eq. 4}$$

When there is no signal (VAD=0), then (suppressing z for clarity)

$$M_{1n}=N_1H_1+N_2H_2+\ldots N_nH_n$$

$$M_{2n}=N_1G_1+N_2G_2+\ldots N_nG_n. \qquad \text{Eq. 5}$$

A new transfer function can now be defined as $$\tilde{H}_1 = \frac{M_{1n}}{M_{2n}} = \frac{N_1H_1 + N_2H_2 + \ldots N_nH_n}{N_1G_1 + N_2G_2 + \ldots N_nG_n}, \qquad \text{Eq. 6}$$

where $\tilde{H}_1$ is analogous to $H_1(z)$ above. Thus $\tilde{H}_1$ depends only on the noise sources and their respective transfer functions and can be calculated any time there is no signal being transmitted. Once again, the "n" subscripts on the microphone inputs denote only that noise is being detected, while an "s" subscript denotes that only signal is being received by the microphones.

Examining Equation 4 while assuming an absence of noise produces $$M_{1s}=S$$

$$M_{2s}=SH_0.$$

Thus, $H_0$ can be solved for as before, using any available transfer function calculating algorithm. Mathematically, then, $$H_0 = \frac{M_{2s}}{M_{1s}}.$$

Rewriting Equation 4, using $\tilde{H}_1$ defined in Equation 6, provides, $$\tilde{H}_1 = \frac{M_1 - S}{M_2 - SH_0}. \qquad \text{Eq. 7}$$

Solving for S yields, $$S = \frac{M_1 - M_2\tilde{H}_1}{1 - H_0\tilde{H}_1}, \qquad \text{Eq. 8}$$

which is the same as Equation 3, with $H_0$ taking the place of $H_2$, and $\tilde{H}_1$ taking the place of $H_1$. Thus the noise removal algorithm still is mathematically valid for any number of noise sources, including multiple echoes of noise sources. Again, if $H_0$ and $\tilde{H}_1$ can be estimated to a high enough accuracy, and the above assumption of only one path from the signal to the microphones holds, the noise may be removed completely.

Figure 4:
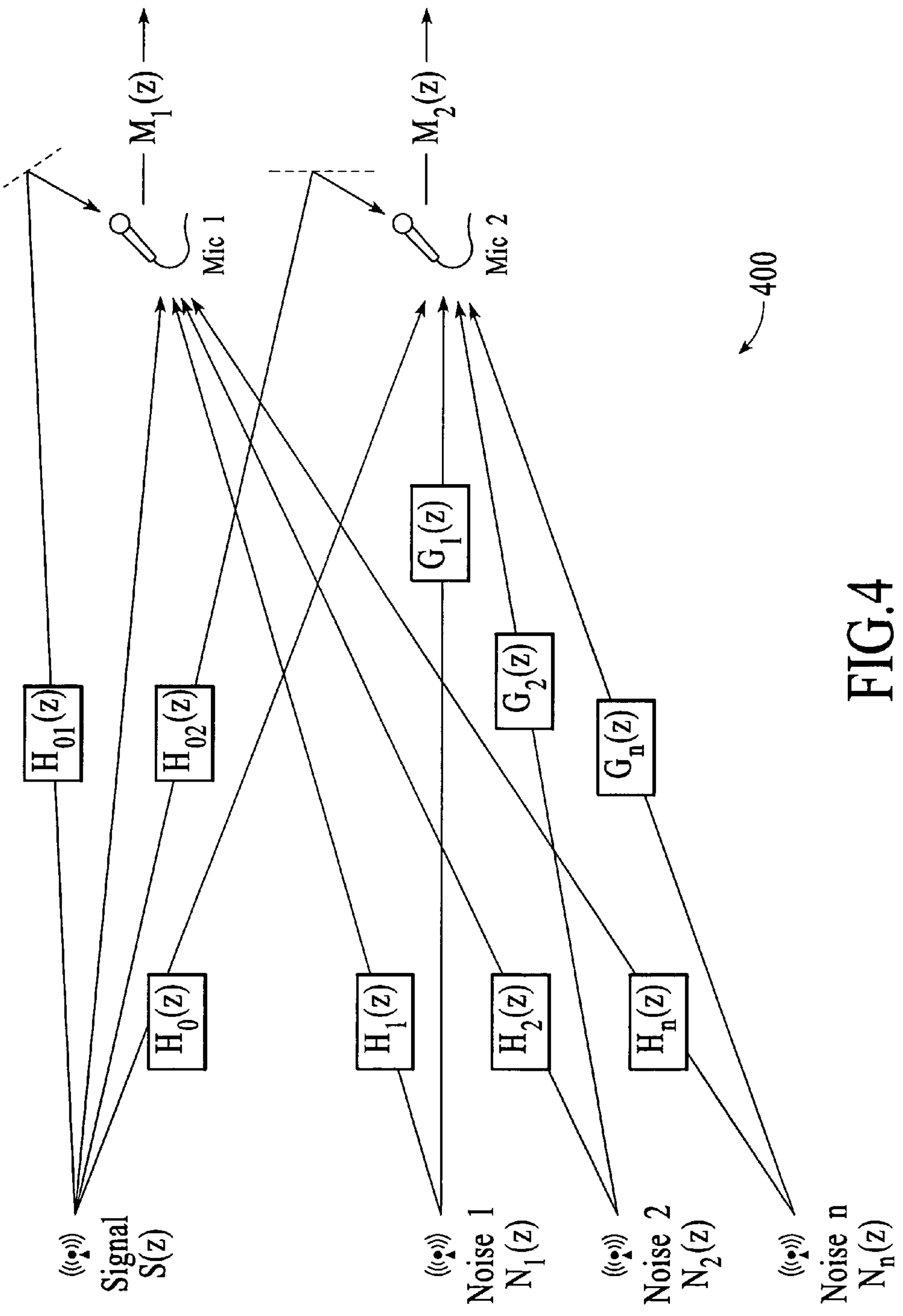
FIG. 4 is a block diagram including front-end components of a noise removal algorithm of an embodiment in a general case where there are n distinct noise sources and signal reflections.

The most general case involves multiple noise sources and multiple signal sources. FIG. 4 is a block diagram including front-end components 400 of a noise removal algorithm of an embodiment in the most general case where there are n distinct noise sources and signal reflections. Here, signal reflections enter both microphones MIC 1 and MIC 2. This is the most general case, as reflections of the noise source into the microphones MIC 1 and MIC 2 can be modeled accurately as simple additional noise sources. For clarity, the direct path from the signal to MIC 2 is changed from $H_0(z)$ to $H_{00}(z)$, and the reflected paths to MIC 1 and MIC 2 are denoted by $H_{01}(z)$ and $H_{02}(z)$, respectively.

The input into the microphones now becomes $$M_1(z)=S(z)+S(z)H_{01}(z)+N_1(z)H_1(z)+N_2(z)H_2(z)+\ldots N_n(z)H_n(z)$$

$$M_2(z)=S(z)H_{00}(z)+S(z)H_{02}(z)+N_1(z)G_1(z)+N_2(z)G_2(z)+\ldots N_n(z)G_n(z). \qquad \text{Eq. 9}$$

When the VAD=0, the inputs become (suppressing z again)

$$M_{1n}=N_1H_1+N_2H_2+\ldots N_nH_n$$

$$M_{2n}=N_1G_1+N_2G_2+\ldots N_nG_n,$$

which is the same as Equation 5. Thus, the calculation of $\tilde{H}_1$ in Equation 6 is unchanged, as expected. In examining the situation where there is no noise, Equation 9 reduces to $$M_{1s}=S+SH_{01}$$

$$M_{2s}=SH_{00}+SH_{02}.$$

This leads to the definition of $\tilde{H}_2$ as $$\tilde{H}_2=\frac{M_{2s}}{M_{1s}}=\frac{H_{00}+H_{02}}{1+H_{01}}. \quad \text{Eq. 10}$$

Rewriting Equation 9 again using the definition for $\tilde{H}_1$ (as in Equation 7) provides $$\tilde{H}_1=\frac{M_1-S(1+H_{01})}{M_2-S(H_{00}+H_{02})}. \quad \text{Eq. 11}$$

Some algebraic manipulation yields $$S(1+H_{01}-\tilde{H}_1(H_{00}+H_{02}))=M_1-M_2\tilde{H}_1$$

$$S(1+H_{01})\left[1-\tilde{H}_1\frac{(H_{00}+H_{02})}{(1+H_{01})}\right]=M_1-M_2\tilde{H}_1$$

$$S(1+H_{01})\left[1-\tilde{H}_1\tilde{H}_2\right]=M_1-M_2\tilde{H}_1,$$

and finally $$S(1+H_{01})=\frac{M_1-M_2\tilde{H}_1}{1-\tilde{H}_1\tilde{H}_2}. \quad \text{Eq. 12}$$

Equation 12 is the same as equation 8, with the replacement of $H_0$ by $\tilde{H}_2$, and the addition of the $(1+H_{01})$ factor on the left side. This extra factor $(1+H_{01})$ means that S cannot be solved for directly in this situation, but a solution can be generated for the signal plus the addition of all of its echoes. This is not such a bad situation, as there are many conventional methods for dealing with echo suppression, and even if the echoes are not suppressed, it is unlikely that they will affect the comprehensibility of the speech to any meaningful extent. The more complex calculation of $\tilde{H}_2$ is needed to account for the signal echoes in MIC 2, which act as noise sources.

Figure 5:
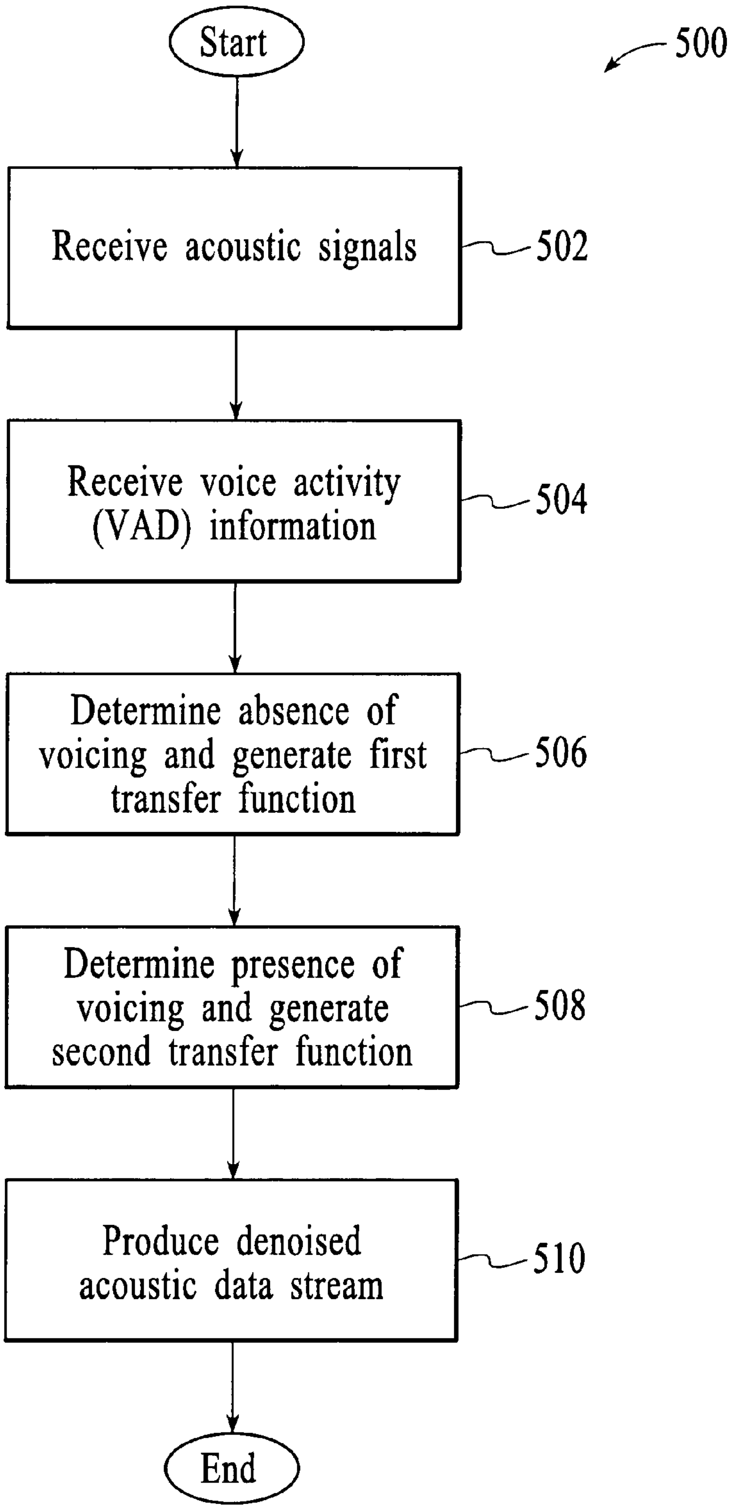
FIG. 5 is a flow diagram of a denoising method, under an embodiment.

FIG. 5 is a flow diagram 500 of a denoising algorithm, under an embodiment. In operation, the acoustic signals are received, at block 502. Further, physiological information associated with human voicing activity is received, at block 504. A first transfer function representative of the acoustic signal is calculated upon determining that voicing information is absent from the acoustic signal for at least one specified period of time, at block 506. A second transfer function representative of the acoustic signal is calculated upon determining that voicing information is present in the acoustic signal for at least one specified period of time, at block 508. Noise is removed from the acoustic signal using at least one combination of the first transfer function and the second transfer function, producing denoised acoustic data streams, at block 510.

An algorithm for noise removal, or denoising algorithm, is described herein, from the simplest case of a single noise source with a direct path to multiple noise sources with reflections and echoes. The algorithm has been shown herein to be viable under any environmental conditions. The type and amount of noise are inconsequential if a good estimate has been made of $\tilde{H}_1$ and $\tilde{H}_2$, and if one does not change substantially while the other is calculated. If the user environment is such that echoes are present, they can be compensated for if coming from a noise source. If signal echoes are also present, they will affect the cleaned signal, but the effect should be negligible in most environments.

In operation, the algorithm of an embodiment has shown excellent results in dealing with a variety of noise types, amplitudes, and orientations. However, there are always approximations and adjustments that have to be made when moving from mathematical concepts to engineering applications. One assumption is made in Equation 3, where $H_2(z)$ is assumed small and therefore $H_2(z)H_1(z)\approx 0$, so that Equation 3 reduces to $$S(z)\approx M_1(z)-M_2(z)H_1(z).$$

This means that only $H_1(z)$ has to be calculated, speeding up the process and reducing the number of computations required considerably. With the proper selection of microphones, this approximation is easily realized.

Another approximation involves the filter used in an embodiment. The actual $H_1(z)$ will undoubtedly have both poles and zeros, but for stability and simplicity an all-zero Finite Impulse Response (FIR) filter is used. With enough taps the approximation to the actual $H_1(z)$ can be very good.

To further increase the performance of the noise suppression system, the spectrum of interest (generally about 125 to 3700 Hz) is divided into subbands. The wider the range of frequencies over which a transfer function must be calculated, the more difficult it is to calculate it accurately. Therefore the acoustic data was divided into 16 subbands, and the denoising algorithm was then applied to each subband in turn. Finally, the 16 denoised data streams were recombined to yield the denoised acoustic data. This works very well, but any combinations of subbands (i.e., 4, 6, 8, 32, equally spaced, perceptually spaced, etc.) can be used and all have been found to work better than a single subband.

The amplitude of the noise was constrained in an embodiment so that the microphones used did not saturate (that is, operate outside a linear response region). It is important that the microphones operate linearly to ensure the best performance. Even with this restriction, very low signal-to-noise ratio (SNR) signals can be denoised (down to −10 dB or less).

The calculation of $H_1(z)$ is accomplished every 10 milliseconds using the Least-Mean Squares (LMS) method, a common adaptive transfer function. An explanation may be found in "Adaptive Signal Processing" (1985), by Widrow and Steams, published by Prentice-Hall, ISBN 0-13-004029-0. The LMS was used for demonstration purposes, but many other system idenfication techniques can be used to identify $H_1(z)$ and $H_2(z)$ in FIG. 2.

The VAD for an embodiment is derived from a radio frequency sensor and the two microphones, yielding very high accuracy (>99%) for both voiced and unvoiced speech. The VAD of an embodiment uses a radio frequency (RF) vibration detector interferometer to detect tissue motion associated with human speech production, but is not so limited. The signal from the RF device is completely acoustic-noise free, and is able to function in any acoustic noise environment. A simple energy measurement of the RF signal can be used to determine if voiced speech is occurring. Unvoiced speech can be determined using conventional acoustic-based methods, by proximity to voiced sections determined using the RF sensor or similar voicing sensors, or through a combination of the above. Since there is much less energy in unvoiced speech, its detection accuracy is not as critical to good noise suppression performance as is voiced speech.

With voiced and unvoiced speech detected reliably, the algorithm of an embodiment can be implemented. Once again, it is useful to repeat that the noise removal algorithm does not depend on how the VAD is obtained, only that it is accurate, especially for voiced speech. If speech is not detected and training occurs on the speech, the subsequent denoised acoustic data can be distorted.

Data was collected in four channels, one for MIC 1, one for MIC 2, and two for the radio frequency sensor that detected the tissue motions associated with voiced speech. The data were sampled simultaneously at 40 kHz, then digitally filtered and decimated down to 8 kHz. The high sampling rate was used to reduce any aliasing that might result from the analog to digital process. A four-channel National Instruments A/D board was used along with Labview to capture and store the data. The data was then read into a C program and denoised 10 milliseconds at a time.

Figure 6:
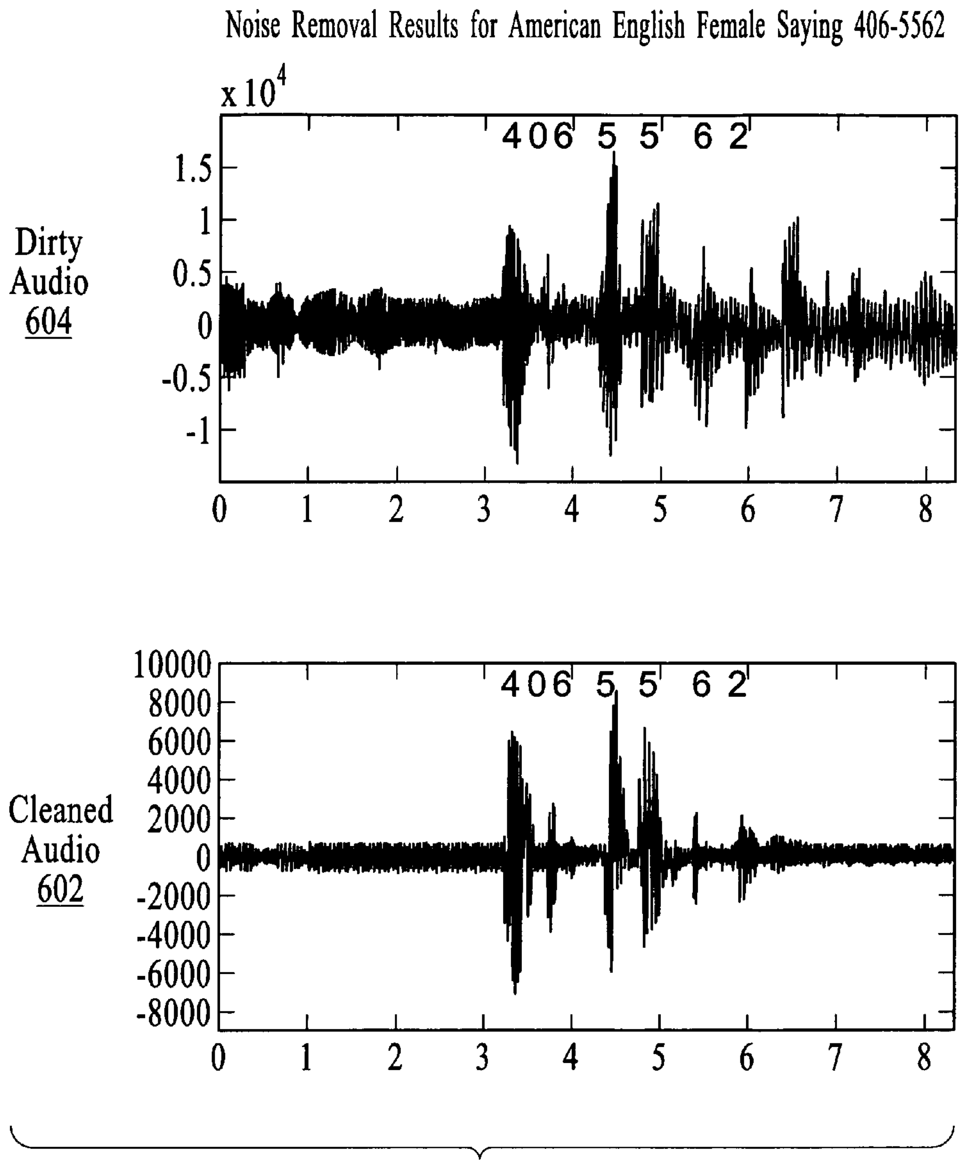
FIG. 6 shows results of a noise suppression algorithm of an embodiment for an American English female speaker in the presence of airport terminal noise that includes many other human speakers and public announcements.

FIG. 6 shows a denoised audio 602 signal output upon application of the noise suppression algorithm of an embodiment to a dirty acoustic signal 604, under an embodiment. The dirty acoustic signal 604 includes speech of an American English-speaking female in the presence of airport terminal noise where the noise includes many other human speakers and public announcements. The speaker is uttering the numbers "406 5562" in the midst of moderate airport terminal noise. The dirty acoustic signal 604 was denoised 10 milliseconds at a time, and before denoising the 10 milliseconds of data were prefiltered from 50 to 3700 Hz. A reduction in the noise of approximately 17 dB is evident. No post filtering was done on this sample; thus, all of the noise reduction realized is due to the algorithm of an embodiment. It is clear that the algorithm adjusts to the noise instantly, and is capable of removing the very difficult noise of other human speakers. Many different types of noise have all been tested with similar results, including street noise, helicopters, music, and sine waves. Also, the orientation of the noise can be varied substantially without significantly changing the noise suppression performance. Finally, the distortion of the cleaned speech is very low, ensuring good performance for speech recognition engines and human receivers alike.

The noise removal algorithm of an embodiment has been shown to be viable under any environmental conditions. The type and amount of noise are inconsequential if a good estimate has been made of $\tilde{H}_1$ and $\tilde{H}_2$. If the user environment is such that echoes are present, they can be compensated for if coming from a noise source. If signal echoes are also present, they will affect the cleaned signal, but the effect should be negligible in most environments.

When using the VAD devices and methods described herein with a noise suppression system, the VAD signal is processed independently of the noise suppression system, so that the receipt and processing of VAD information is independent from the processing associated with the noise suppression, but the embodiments are not so limited. This independence is attained physically (i.e., different hardware for use in receiving and processing signals relating to the VAD and the noise suppression), but is not so limited.

The VAD devices/methods described herein generally include vibration and movement sensors, but are not so limited. In one embodiment, an accelerometer is placed on the skin for use in detecting skin surface vibrations that correlate with human speech. These recorded vibrations are then used to calculate a VAD signal for use with or by an adaptive noise suppression algorithm in suppressing environmental acoustic noise from a simultaneously (within a few milliseconds) recorded acoustic signal that includes both speech and noise.

Another embodiment of the VAD devices/methods described herein includes an acoustic microphone modified with a membrane so that the microphone no longer efficiently detects acoustic vibrations in air. The membrane, though, allows the microphone to detect acoustic vibrations in objects with which it is in physical contact (allowing a good mechanical impedance match), such as human skin. That is, the acoustic microphone is modified in some way such that it no longer detects acoustic vibrations in air (where it no longer has a good physical impedance match), but only in objects with which the microphone is in contact. This configures the microphone, like the accelerometer, to detect vibrations of human skin associated with the speech production of that human while not efficiently detecting acoustic environmental noise in the air. The detected vibrations are processed to form a VAD signal for use in a noise suppression system, as detailed below.

Yet another embodiment of the VAD described herein uses an electromagnetic vibration sensor, such as a radiofrequency vibrometer (RF) or laser vibrometer, which detect skin vibrations. Further, the RF vibrometer detects the movement of tissue within the body, such as the inner surface of the cheek or the tracheal wall. Both the exterior skin and internal tissue vibrations associated with speech production can be used to form a VAD signal for use in a noise suppression system as detailed below.

Figure 7A:
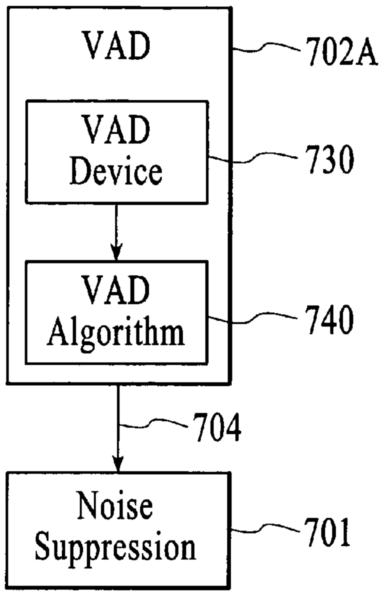
FIG. 7A is a block diagram of a Voice Activity Detector (VAD) system including hardware for use in receiving and processing signals relating to VAD, under an embodiment.

FIG. 7A is a block diagram of a VAD system 702A including hardware for use in receiving and processing signals relating to VAD, under an embodiment. The VAD system 702A includes a VAD device 730 coupled to provide data to a corresponding VAD algorithm 740. Note that noise suppression systems of alternative embodiments can integrate some or all functions of the VAD algorithm with the noise suppression processing in any manner obvious to those skilled in the art. Referring to FIG. 1, the voicing sensors 20 include the VAD system 702A, for example, but are not so limited. Referring to FIG. 2, the VAD includes the VAD system 702A, for example, but is not so limited.

Figure 7B:
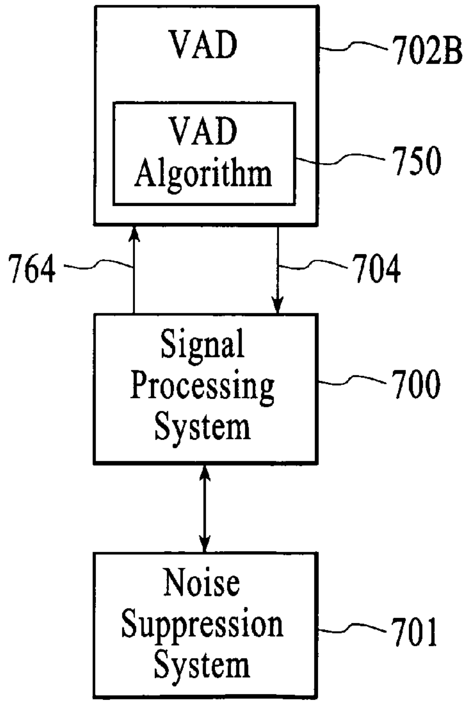
FIG. 7B is a block diagram of a VAD system using hardware of a coupled noise suppression system for use in receiving VAD information, under an alternative embodiment.

FIG. 7B is a block diagram of a VAD system 702B using hardware of the associated noise suppression system 701 for use in receiving VAD information 764, under an embodiment. The VAD system 702B includes a VAD algorithm 750 that receives data 764 from MIC 1 and MIC 2, or other components, of the corresponding signal processing system 700. Alternative embodiments of the noise suppression system can integrate some or all functions of the VAD algorithm with the noise suppression processing in any manner obvious to those skilled in the art.

The vibration/movement-based VAD devices described herein include the physical hardware devices for use in receiving and processing signals relating to the VAD and the noise suppression. As a speaker or user produces speech, the resulting vibrations propagate through the tissue of the speaker and, therefore can be detected on and beneath the skin using various methods. These vibrations are an excellent source of VAD information, as they are strongly associated with both voiced and unvoiced speech (although the unvoiced speech vibrations are much weaker and more difficult to detect) and generally are only slightly affected by environmental acoustic noise (some devices/methods, for example the electromagnetic vibrometers described below, are not affected by environmental acoustic noise). These tissue vibrations or movements are detected using a number of VAD devices including, for example, accelerometer-based devices, skin surface microphone (SSM) devices, and electromagnetic (EM) vibrometer devices including both radio frequency (RF) vibrometers and laser vibrometers.

Accelerometer-Based VAD Devices/Methods

Accelerometers can detect skin vibrations associated with speech. As such, and with reference to FIG. 2 and FIG. 7A, a VAD system 702A of an embodiment includes an accelerometer-based device 730 providing data of the skin vibrations to an associated algorithm 740. The algorithm 740 of an embodiment uses energy calculation techniques along with a threshold comparison, as described herein, but is not so limited. Note that more complex energy-based methods are available to those skilled in the art.

Figure 8:
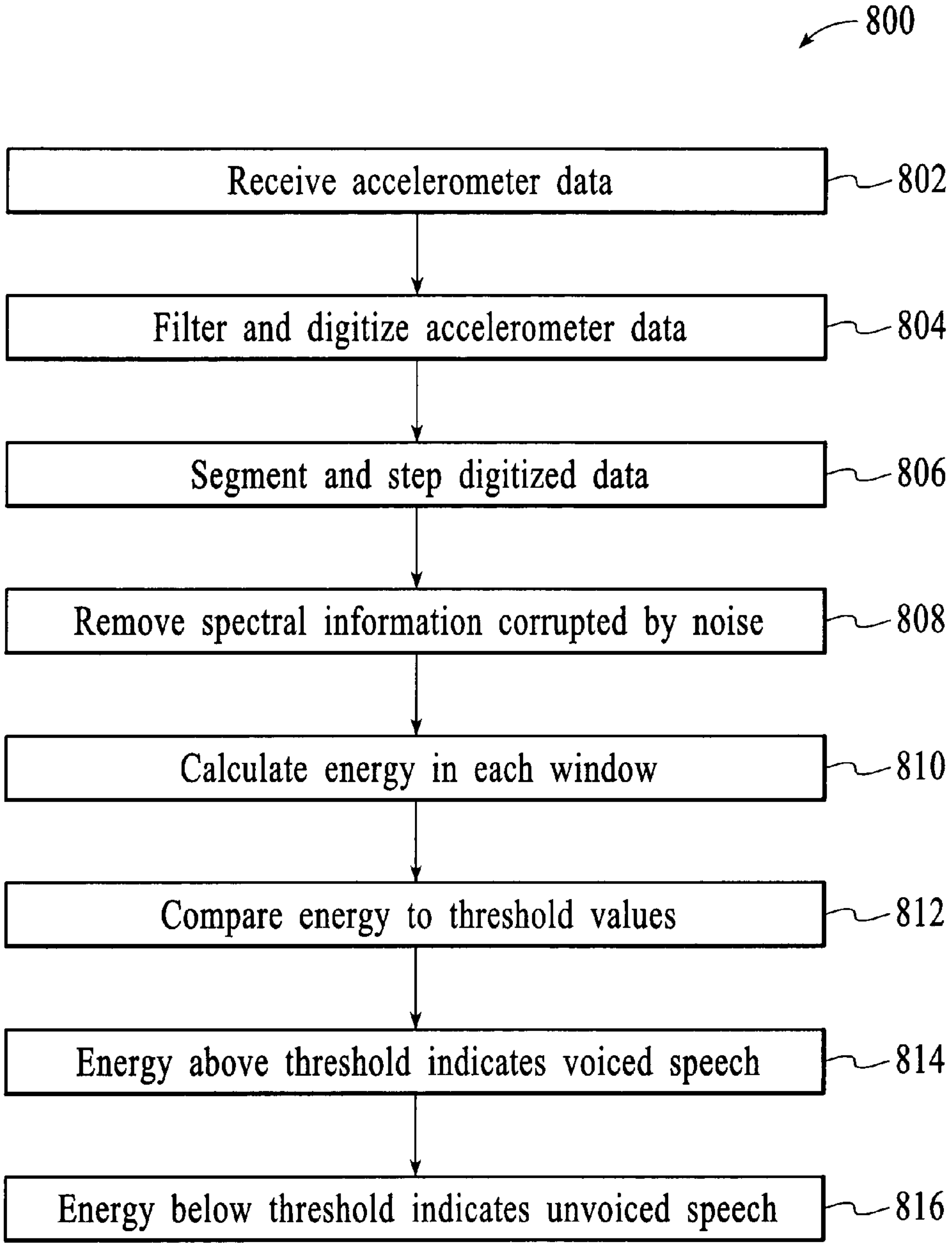
FIG. 8 is a flow diagram of a method for determining voiced and unvoiced speech using an accelerometer-based VAD, under an embodiment.

FIG. 8 is a flow diagram 800 of a method for determining voiced and unvoiced speech using an accelerometer-based VAD, under an embodiment. Generally, the energy is calculated by defining a standard window size over which the calculation is to take place and summing the square of the amplitude over time as $$\text{Energy} = \sum_i x_i^2,$$

where i is the digital sample subscript and ranges from the beginning of the window to the end of the window.

Referring to FIG. 8, operation begins upon receiving accelerometer data, at block 802. The processing associated with the VAD includes filtering the data from the accelerometer to preclude aliasing, and digitizing the filtered data for processing, at block 804. The digitized data is segmented into windows 20 milliseconds (msec) in length, and the data is stepped 8 msec at a time, at block 806. The processing further includes filtering the windowed data, at block 808, to remove spectral information that is corrupted by noise or is otherwise unwanted. The energy in each window is calculated by summing the squares of the amplitudes as described above, at block 810. The calculated energy values can be normalized by dividing the energy values by the window length; however, this involves an extra calculation and is not needed as long as the window length is not varied.

The calculated, or normalized, energy values are compared to a threshold, at block 812. The speech corresponding to the accelerometer data is designated as voiced speech when the energy of the accelerometer data is at or above a threshold value, at block 814. Likewise, the speech corresponding to the accelerometer data is designated as unvoiced speech when the energy of the accelerometer data is below the threshold value, at block 816. Noise suppression systems of alternative embodiments can use multiple threshold values to indicate the relative strength or confidence of the voicing signal, but are not so limited. Multiple subbands may also be processed for increased accuracy.

Figure 9:
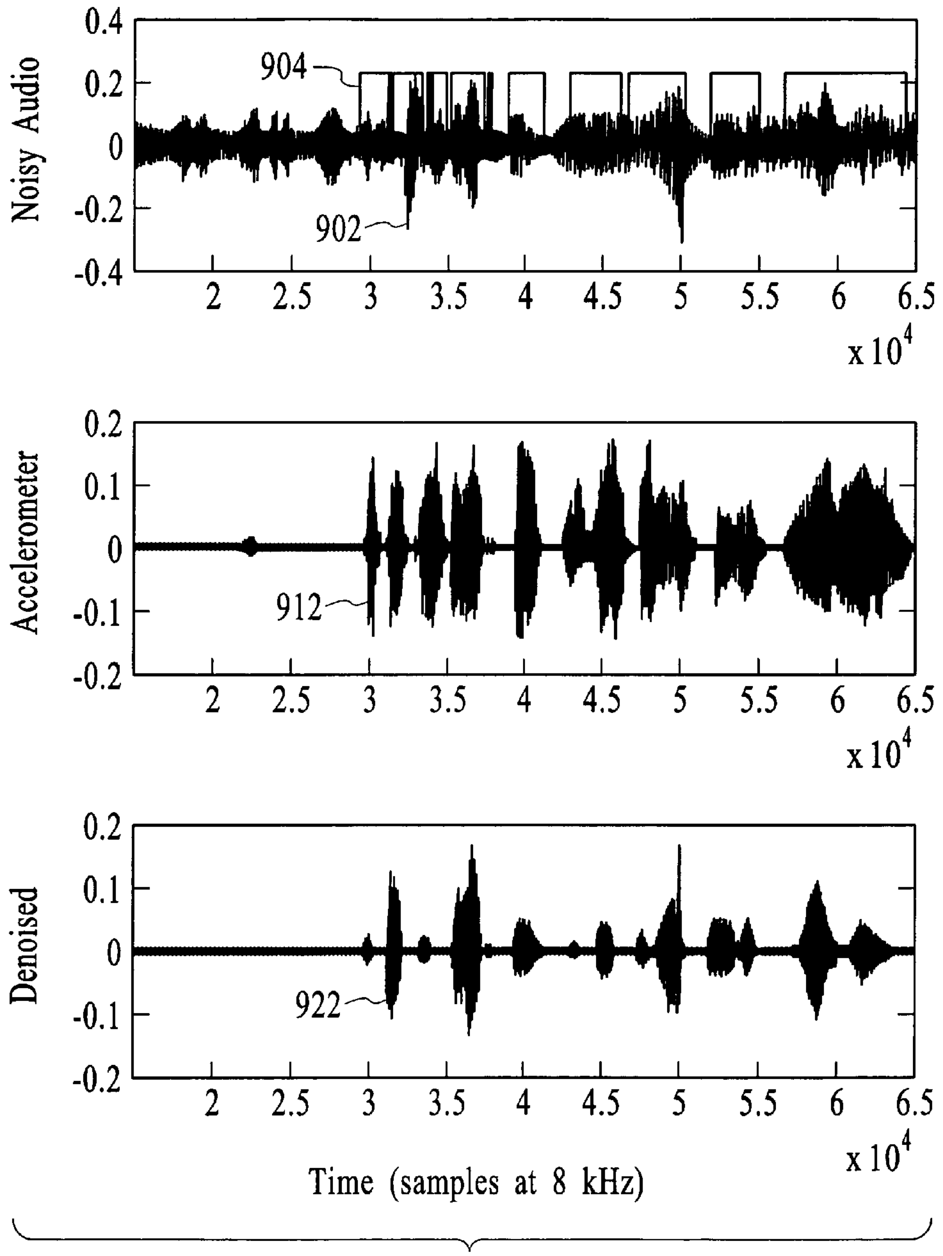
FIG. 9 shows plots including a noisy audio signal (live recording) along with a corresponding accelerometer-based VAD signal, the corresponding accelerometer output signal, and the denoised audio signal following processing by the noise suppression system using the VAD signal, under an embodiment.

FIG. 9 shows plots including a noisy audio signal (live recording) 902 along with a corresponding accelerometer-based VAD signal 904, the corresponding accelerometer output signal 912, and the denoised audio signal 922 following processing by the noise suppression system using the VAD signal 904, under an embodiment. The noise suppression system of this embodiment includes an accelerometer (Model 352A24) from PCB Piezotronics, but is not so limited. In this example, the accelerometer data has been bandpass filtered between 500 and 2500 Hz to remove unwanted acoustic noise that can couple to the accelerometer below 500 Hz. The audio signal 902 was recorded using a microphone set and standard accelerometer in a babble noise environment inside a chamber measuring six (6) feet on a side and having a ceiling height of eight (8) feet. The microphone set, for example, is available from Aliph, Brisbane, Calif. The noise suppression system is implemented in real-time, with a delay of approximately 10 msec. The difference in the raw audio signal 902 and the denoised audio signal 922 shows noise suppression approximately in the range of 25-30 dB with little distortion of the desired speech signal. Thus, denoising using the accelerometer-based VAD information is very effective.

Skin Surface Microphone (SSM) VAD Devices/Methods

Referring again to FIG. 2 and FIG. 7A, a VAD system 702A of an embodiment includes a SSM VAD device 730 providing data to an associated algorithm 740. The SSM is a conventional microphone modified to prevent airborne acoustic information from coupling with the microphone's detecting elements. A layer of silicone or other covering changes the impedance of the microphone and prevents airborne acoustic information from being detected to a significant degree. Thus this microphone is shielded from airborne acoustic energy but is able to detect acoustic waves traveling in media other than air as long as it maintains physical contact with the media. The silicone or similar material allows the microphone to mechanically couple efficiently with the skin of the user.

During speech, when the SSM is placed on the cheek or neck, vibrations associated with speech production are easily detected. However, airborne acoustic data is not significantly detected by the SSM. The tissue-borne acoustic signal, upon detection by the SSM, is used to generate the VAD signal in processing and denoising the signal of interest, as described above with reference to the energy/threshold method used with accelerometer-based VAD signal and FIG. 8.

Figure 10:
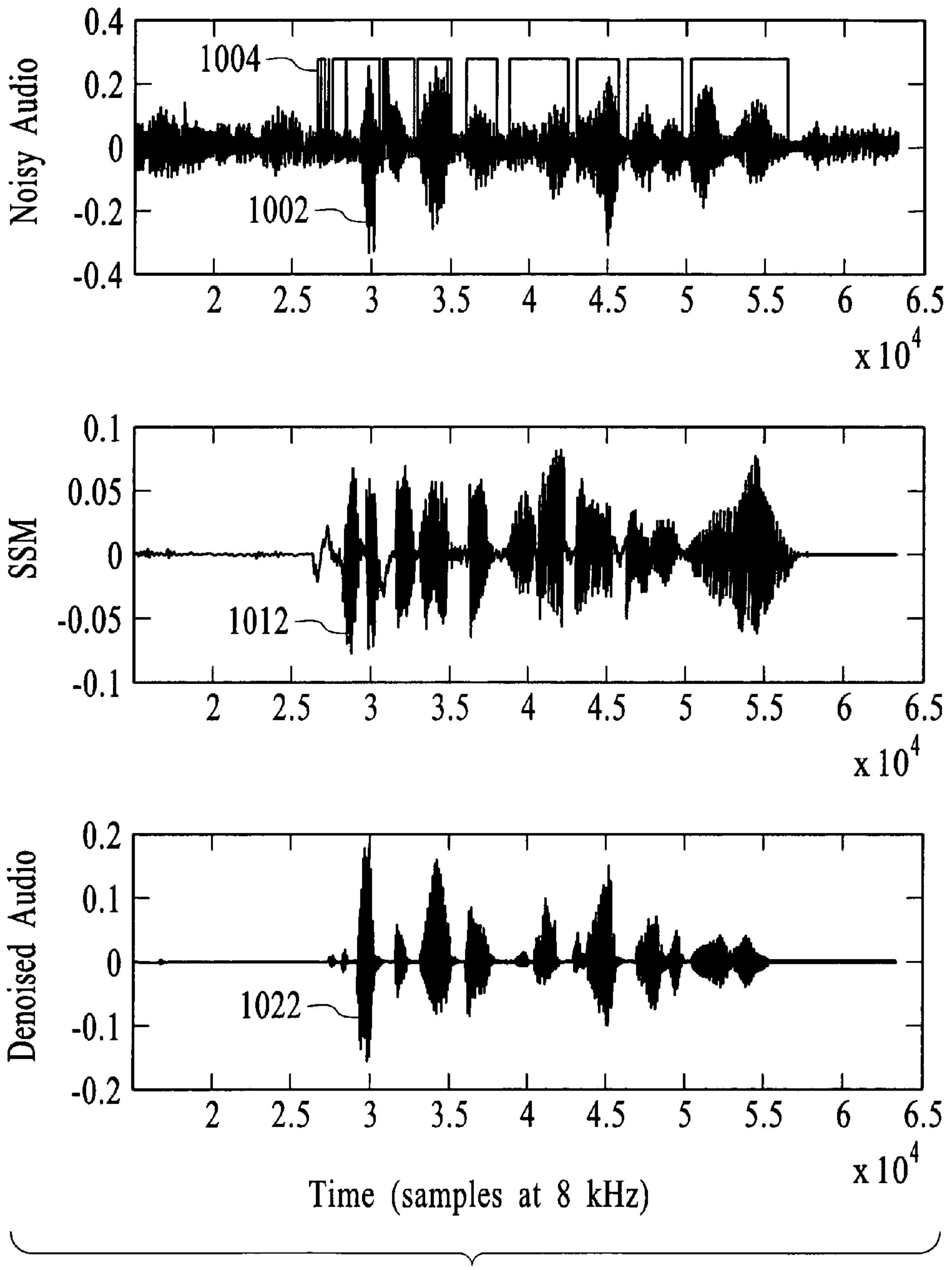
FIG. 10 shows plots including a noisy audio signal (live recording) along with a corresponding SSM-based VAD signal, the corresponding SSM output signal, and the denoised audio signal following processing by the noise suppression system using the VAD signal, under an embodiment.

FIG. 10 shows plots including a noisy audio signal (live recording) 1002 along with a corresponding SSM-based VAD signal 1004, the corresponding SSM output signal 1012, and the denoised audio signal 1022 following processing by the noise suppression system using the VAD signal 1004, under an embodiment. The audio signal 1002 was recorded using an Aliph microphone set and standard accelerometer in a babble noise environment inside a chamber measuring six (6) feet on a side and having a ceiling height of eight (8) feet. The noise suppression system is implemented in real-time, with a delay of approximately 10 msec. The difference in the raw audio signal 1002 and the denoised audio signal 1022 clearly show noise suppression approximately in the range of 20-25 dB with little distortion of the desired speech signal. Thus, denoising using the SSM-based VAD information is effective.

Electromagnetic (EM) Vibrometer VAD Devices/Methods

Returning to FIG. 2 and FIG. 7A, a VAD system 702A of an embodiment includes an EM vibrometer VAD device 730 providing data to an associated algorithm 740. The EM vibrometer devices also detect tissue vibration, but can do so at a distance and without direct contact of the tissue targeted for measurement. Further, some EM vibrometer devices can detect vibrations of internal tissue of the human body. The EM vibrometers are unaffected by acoustic noise, making them good choices for use in high noise environments. The noise suppression system of an embodiment receives VAD information from EM vibrometers including, but not limited to, RF vibrometers and laser vibrometers, each of which are described in turn below.

The RF vibrometer operates in the radio to microwave portion of the electromagnetic spectrum, and is capable of measuring the relative motion of internal human tissue associated with speech production. The internal human tissue includes tissue of the trachea, cheek, jaw, and/or nose/nasal passages, but is not so limited. The RF vibrometer senses movement using low-power radio waves, and data from these devices has been shown to correspond very well with calibrated targets. As a result of the absence of acoustic noise in the RF vibrometer signal, the VAD system of an embodiment uses signals from these devices to construct a VAD using the energy/threshold method described above with reference to the accelerometer-based VAD and FIG. 8.

An example of an RF vibrometer is the General Electromagnetic Motion Sensor (GEMS) radiovibrometer available from Aliph, located in Brisbane, Calif. Other RF vibrometers are described in the Related Applications and by Gregory C. Burnett in "The Physiological Basis of Glottal Electromagnetic Micropower Sensors (GEMS) and Their Use in Defining an Excitation Function for the Human Vocal Tract", Ph.D. Thesis, University of California Davis, January 1999.

Laser vibrometers operate at or near the visible frequencies of light, and are therefore restricted to surface vibration detection only, similar to the accelerometer and the SSM described above. Like the RF vibrometer, there is no acoustic noise associated with the signal of the laser vibrometers. Therefore, the VAD system of an embodiment uses signals from these devices to construct a VAD using the energy/threshold method described above with reference to the accelerometer-based VAD and FIG. 8.

Figure 11:
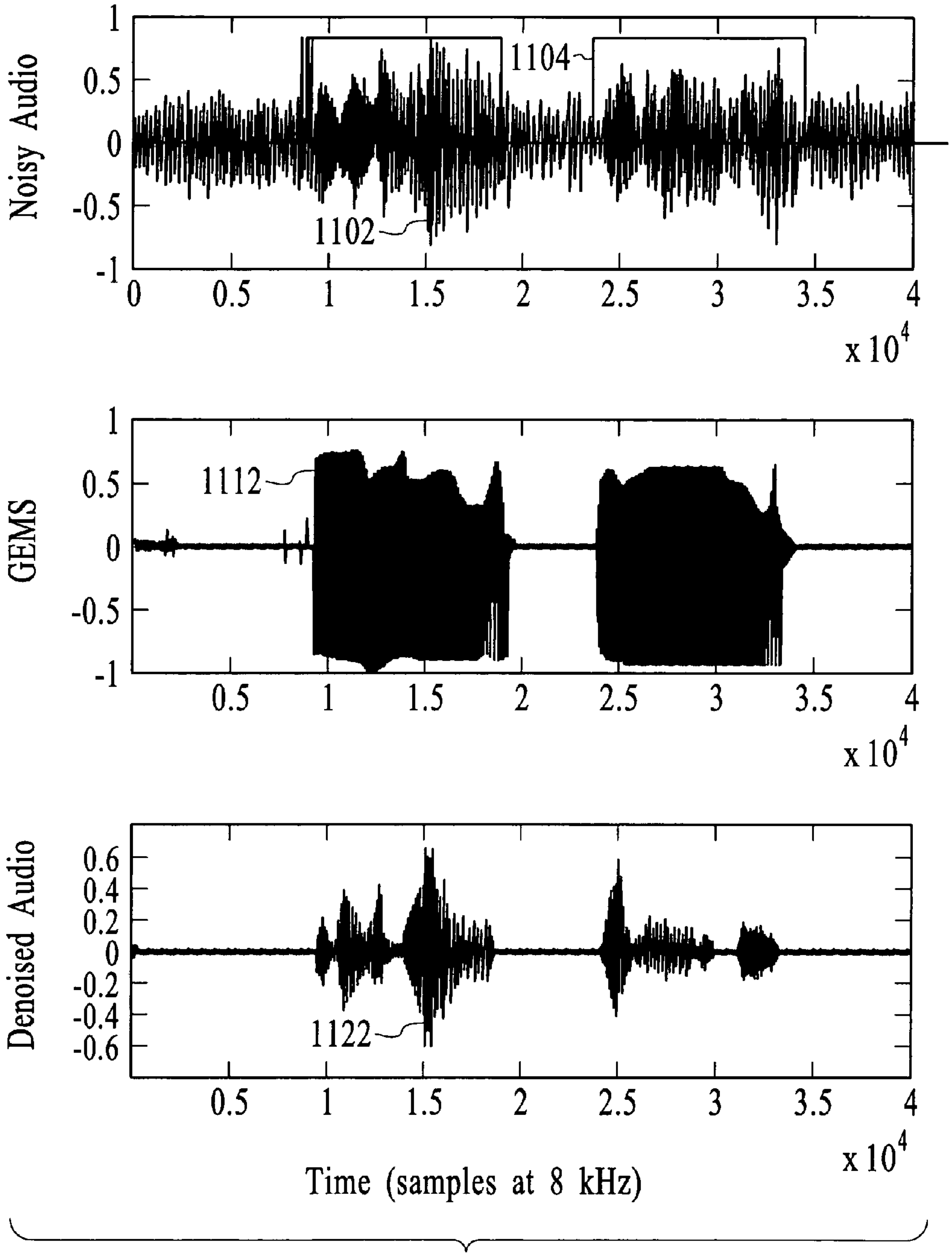
FIG. 11 shows plots including a noisy audio signal (live recording) along with a corresponding GEMS-based VAD signal, the corresponding GEMS output signal, and the denoised audio signal following processing by the noise suppression system using the VAD signal, under an embodiment.

FIG. 11 shows plots including a noisy audio signal (live recording) 1102 along with a corresponding GEMS-based VAD signal 1104, the corresponding GEMS output signal 1112, and the denoised audio signal 1122 following processing by the noise suppression system using the VAD signal 1104, under an embodiment. The GEMS-based VAD signal 1104 was received from a trachea-mounted GEMS radiovibrometer from Aliph, Brisbane, Calif. The audio signal 1102 was recorded using an Aliph microphone set in a babble noise environment inside a chamber measuring six (6) feet on a side and having a ceiling height of eight (8) feet. The noise suppression system is implemented in real-time, with a delay of approximately 10 msec. The difference in the raw audio signal 1102 and the denoised audio signal 1122 clearly show noise suppression approximately in the range of 20-25 dB with little distortion of the desired speech signal. Thus, denoising using the GEMS-based VAD information is effective. It is clear that both the VAD signal and the denoising are effective, even though the GEMS is not detecting unvoiced speech. Unvoiced speech is normally low enough in energy that it does not significantly affect the convergence of $H_1(z)$ and therefore the quality of the denoised speech.

Aspects of the noise suppression system may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the noise suppression system include: microcontrollers with memory (such as electronically erasable programmable read only memory (EEPROM)), embedded microprocessors, firmware, software, etc. If aspects of the noise suppression system are embodied as software at least one stage during manufacturing (e.g. before being embedded in firmware or in a PLD), the software may be carried by any computer readable medium, such as magnetically- or optically-readable disks (fixed or floppy), modulated on a carrier signal or otherwise transmitted, etc.

Furthermore, aspects of the noise suppression system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, shall refer to this application as a whole and not to any particular portions of this application. When the word "or" is used in reference to a list of two or more items, that word covers all of the following interpretations of the word: any of the items in the list, all of the items in the list and any combination of the items in the list.

The above descriptions of embodiments of the noise suppression system are not intended to be exhaustive or to limit the noise suppression system to the precise forms disclosed. While specific embodiments of, and examples for, the noise suppression system are described herein for illustrative purposes, various equivalent modifications are possible within the scope of the noise suppression system, as those skilled in the relevant art will recognize. The teachings of the noise suppression system provided herein can be applied to other processing systems and communication systems, not only for the processing systems described above.

The elements and acts of the various embodiments described above can be combined to provide further embodiments. These and other changes can be made to the noise suppression system in light of the above detailed description.

All of the above references and United States patent applications are incorporated herein by reference. Aspects of the noise suppression system can be modified, if necessary, to employ the systems, functions and concepts of the various patents and applications described above to provide yet further embodiments of the noise suppression system.

In general, in the following claims, the terms used should not be construed to limit the noise suppression system to the specific embodiments disclosed in the specification and the claims, but should be construed to include all processing systems that operate under the claims to provide a method for compressing and decompressing data files or streams. Accordingly, the noise suppression system is not limited by the disclosure, but instead the scope of the noise suppression system is to be determined entirely by the claims.

While certain aspects of the noise suppression system are presented below in certain claim forms, the inventors contemplate the various aspects of the noise suppression system in any number of claim forms. For example, while only one aspect of the noise suppression system is recited as embodied in computer-readable medium, other aspects may likewise be embodied in computer-readable medium. Accordingly, the inventors reserve the right to add additional claims after filing the application to pursue such additional claim forms for other aspects of the noise suppression system.

What we claim is:

1. A method for removing noise from acoustic signals, comprising:

receiving at least two acoustic signals using at least two acoustic microphones positioned in a plurality of locations;

receiving a voice activity signal that includes information on vibration of human tissue associated with human voicing activity of a user;

generating a voice activity detection (VAD) signal using the voice activity signal;

generating at least two transfer functions representative of a ratio of energy of the acoustic signal received using at least two different acoustic microphones of the at least two acoustic microphones when the VAD indicates that user voicing activity is absent, wherein the at least two transfer functions comprise a first transfer function and a second transfer function; and removing acoustic noise from at least one of the acoustic signals by applying the first transfer function and at least one combination of the first transfer function and the second transfer function to the acoustic signals and generating denoised acoustic signals.

2. The method of claim 1, wherein removing noise further comprises:

generating one transfer function of the at least two transfer functions to be representative of a ratio of energy of the acoustic signal received when the VAD indicates that user voice activity is present; and removing noise from the acoustic signals using at least one combination of the at least two transfer functions to generate the denoised acoustic signals.

3. The method of claim 1, wherein the acoustic signals include at least one reflection of at least one associated noise source signal and at least one reflection of at least one acoustic source signal.

4. The method of claim 1, wherein generating the at least two transfer functions comprises recalculating the at least two transfer functions during at least one prespecified interval.

5. The method of claim 1, wherein generating the at least two transfer functions comprises use of at least one technique selected from a group consisting of adaptive techniques and recursive techniques.

6. The method of claim 1, wherein information on the vibration of human tissue is provided by a sensor in contact with the skin.

7. The method of claim 1, wherein information on the vibration of human tissue is provided via at least one sensor selected from among at least one of an accelerometer, a skin surface microphone in physical contact with skin of a user, a human tissue vibration detector, a radio frequency (RF) vibration detector, and a laser vibration detector.

8. The method of claim 1, wherein the human tissue is at least one of on a surface of a head, near the surface of the head, on a surface of a neck, near the surface of the neck, on a surface of a chest, and near the surface of the chest.

9. The method of claim 1, further comprising:

dividing acoustic data of the acoustic signals into a plurality of subbands;

generating a subband transfer function representative of the ratio of acoustic energies received in each microphone in each subband;

removing acoustic noise from each of the plurality of subbands using the subband transfer function, wherein a plurality of denoised acoustic subband signals are generated; and combining the plurality of denoised acoustic subband signals to generate the denoised acoustic signal.

10. The method of claim 1, wherein the at least two acoustic microphones comprise a first directional acoustic microphone and a second directional acoustic microphone, wherein the first directional acoustic microphone and the second directional acoustic microphone selectively attenuate the acoustic signals based on the direction of arrival.

11. A system for removing acoustic noise from the acoustic signals, comprising:

a receiver that receives at least two acoustic signals via at least two acoustic microphones positioned in a plurality of locations;

at least one sensor that receives human tissue vibration information associated with human voicing activity of a user;

a processor coupled among the receiver and the at least one sensor that generates a plurality of transfer functions, wherein the plurality of transfer functions includes a first transfer function representative of a ratio of energy of acoustic signals received using at least two different acoustic microphones of the at least two acoustic microphones, wherein the first transfer function is generated in response to a determination that voicing activity is absent from the acoustic signals for a period of time, wherein the plurality of transfer functions includes a second transfer function representative of the acoustic signals, wherein the second transfer function is generated in response to a determination that voicing activity is present in the acoustic signals for the period of time, wherein acoustic noise is removed from the acoustic signals using the first transfer function and at least one combination of the first transfer function and the second transfer function to produce the denoised acoustic data stream.

12. The system of claim 11, wherein the sensor includes a mechanical sensor in contact with the skin.

13. The system of claim 11, wherein the sensor includes at least one of an accelerometer, a skin surface microphone in physical contact with skin of a user, a human tissue vibration detector, a radio frequency (RF) vibration detector, and a laser vibration detector.

14. The system of claim 11, wherein the human tissue is at least one of on a surface of a head, near the surface of the head, on a surface of a neck, near the surface of the neck, on a surface of a chest, and near the surface of the chest.

15. The system of claim 11, further comprising:

dividing acoustic data of the acoustic signals into a plurality of subbands;

generating a transfer function representative of the ratio of acoustic energies received in each microphone in each subband;

removing acoustic noise from each of the plurality of subbands using a transfer function, wherein a plurality of denoised acoustic data streams are generated; and combining the plurality of denoised acoustic data streams to generate the denoised acoustic data stream.

16. The system of claim 11, wherein the receiver includes a plurality of independently located microphones.

17. The system of claim 11, wherein the at least two acoustic microphones comprise a first directional acoustic microphone and a second directional acoustic microphone, wherein the first directional acoustic microphone and the second directional acoustic microphone selectively attenuate the acoustic signals based on the direction of arrival.

18. A signal processing system coupled among a user and an electronic device, wherein the signal processing system includes a denoising subsystem for removing acoustic noise from acoustic signals, the denoising subsystem comprising a processor coupled among a receiver and at least one sensor, wherein the receiver is coupled to receive the acoustic signals via at least two microphones, wherein the at least one sensor detects human tissue vibration associated with human voicing activity of a user, wherein the processor generates a plurality of transfer functions, wherein a first transfer function representative of a ratio of acoustic energy received by the two microphones is generated in response to a determination that voicing activity is absent from the acoustic signals for a specified period of time, wherein a second transfer function representative of the acoustic signals is generated in response to a determination that voicing activity is present in the acoustic signals for a specified period of time, wherein acoustic noise is removed from the acoustic signals using the first transfer function and at least one combination of the first transfer function and the second transfer function to produce a denoised acoustic data stream.

19. The system of claim 18, wherein the at least one electronic device includes at least one of cellular telephones, personal digital assistants, portable communication devices, computers, video cameras, digital cameras, and telematics systems.

20. The system of claim 18, wherein the human tissue is at least one of on a surface of a head, near the surface of the head, on a surface of a neck, near the surface of the neck, on a surface of a chest, and near the surface of the chest.

* * * * *